(12) United States Patent
Roberts et al.

(10) Patent No.: US 7,850,257 B2
(45) Date of Patent: *Dec. 14, 2010

(54) TICKET DISPENSING DEVICE, INSTALLATION AND DISPLAYS

(76) Inventors: Brian J. Roberts, 3559 Ames Pl., Carlsbad, CA (US) 92008; David B. Petch, 5425 Calumet Dr., La Jolla, CA (US) 92037

( * ) Notice: Subject to any disclaimer, the term of this patent is extended or adjusted under 35 U.S.C. 154(b) by 0 days.

This patent is subject to a terminal disclaimer.

(21) Appl. No.: 11/294,805

(22) Filed: Dec. 5, 2005

(65) Prior Publication Data

US 2006/0081674 A1    Apr. 20, 2006

Related U.S. Application Data

(63) Continuation of application No. 09/394,660, filed on Sep. 13, 1999, now Pat. No. 7,032,793, which is a continuation-in-part of application No. 09/238,682, filed on Jan. 26, 1999, now Pat. No. 6,726,077, which is a continuation-in-part of application No. 09/128,406, filed on Aug. 3, 1998, now abandoned, which is a continuation-in-part of application No. 09/060,423, filed on Apr. 14, 1998, now abandoned.

(51) Int. Cl.
*B65D 83/12* (2006.01)
*B26F 3/02* (2006.01)
(52) U.S. Cl. .................. 312/34.4; 206/503; 225/39; 225/41; 463/17; 221/45; 221/155
(58) Field of Classification Search ............ 225/2, 225/4, 5, 39, 41, 42, 100, 103–105; 206/391, 206/409, 503; 221/26, 61, 62; 312/34.4, 312/34.7; 463/17; D6/515; D20/2
See application file for complete search history.

(56) References Cited

U.S. PATENT DOCUMENTS 1,767,784 A    6/1930    Cooke
2,164,698 A    7/1939    Buckley (Continued)

FOREIGN PATENT DOCUMENTS

CA    2379687    11/2005

(Continued)

OTHER PUBLICATIONS

Advertisement: "Take-a-Ticket" Dispenser, Public Gaming, Oct. 1998.

(Continued)

*Primary Examiner*—Jason Daniel Prone
(74) *Attorney, Agent, or Firm*—Sullivan & Worcester, LLP; Christopher T McWhinney

(57) ABSTRACT

A lottery ticket dispenser which may include a housing having a bottom support structure, a pair of side walls extending upwardly from the bottom support structure, and a front wall hinged adjacent its bottom edge to the bottom support structure at a first side so as to swing outwardly and downwardly. The lottery ticket dispenser may also include a transparent cover hinged to the bottom support structure that includes a space shaped to contain a plurality of arrays of tickets in strips.

14 Claims, 5 Drawing Sheets

U.S. PATENT DOCUMENTS

| | | | |
|---|---|---|---|
| 2,191,497 A | 2/1940 | Potdevin et al. | |
| 2,482,714 A | 9/1949 | Mell | |
| 2,578,115 A | 12/1951 | West | |
| 2,601,200 A | 6/1952 | Amos et al. | |
| 2,643,619 A | 6/1953 | Bonebrake | |
| 2,752,106 A | 6/1956 | Thompson | |
| 2,836,018 A | 5/1958 | Key | |
| 3,102,671 A | 9/1963 | Gershen | |
| 3,659,766 A | 5/1972 | Alago | |
| 3,888,399 A | 6/1975 | Hanson et al. | |
| 3,991,924 A | 11/1976 | Schueler | |
| 4,011,975 A | 3/1977 | Brown, Jr. | |
| 4,107,777 A | 8/1978 | Pearson et al. | |
| 4,145,035 A | 3/1979 | Moser | |
| 4,157,670 A | 6/1979 | Herring | |
| RE30,398 E | 9/1980 | Schueler | |
| 4,252,453 A * | 2/1981 | Estabrooks | 400/690.1 |
| 4,412,292 A | 10/1983 | Sedam et al. | |
| 4,454,973 A | 6/1984 | Irvine | |
| 4,473,218 A | 9/1984 | Dudek | |
| 4,529,114 A | 7/1985 | Casper et al. | |
| 4,542,842 A | 9/1985 | Reba | |
| 4,556,210 A * | 12/1985 | George | 271/157 |
| 4,577,789 A | 3/1986 | Hofmann et al. | |
| 4,592,669 A * | 6/1986 | Lohse et al. | 400/621 |
| 4,618,085 A | 10/1986 | Kimura et al. | |
| 4,677,553 A | 6/1987 | Roberts et al. | |
| 4,716,799 A | 1/1988 | Hartmann | |
| 4,738,384 A | 4/1988 | Tigner | |
| 4,858,806 A | 8/1989 | Schafer | |
| 4,910,602 A * | 3/1990 | Sakuragi | 358/296 |
| 4,949,606 A | 8/1990 | Pfeiffer | |
| 4,982,337 A | 1/1991 | Burr et al. | |
| 4,995,507 A | 2/1991 | Schafer | |
| 5,100,038 A | 3/1992 | Schafer | |
| 5,119,295 A | 6/1992 | Kapur | |
| 5,131,561 A | 7/1992 | Casperson et al. | |
| 5,133,615 A | 7/1992 | Saito et al. | |
| 5,146,820 A | 9/1992 | Nemeth et al. | |
| 5,158,293 A | 10/1992 | Mullins | |
| 5,160,076 A | 11/1992 | Ford | |
| 5,176,224 A * | 1/1993 | Spector | 186/52 |
| 5,186,463 A | 2/1993 | Marin et al. | |
| 5,219,158 A * | 6/1993 | Kilian et al. | 271/207 |
| 5,222,624 A | 6/1993 | Burr | |
| 5,282,127 A | 1/1994 | Mii | |
| 5,282,620 A | 2/1994 | Keesee | |
| 5,286,023 A | 2/1994 | Wood | |
| 5,290,033 A | 3/1994 | Bittner et al. | |
| 5,305,937 A | 4/1994 | Barnett | |
| 5,317,135 A | 5/1994 | Finocchio | |
| 5,358,094 A * | 10/1994 | Molinaro et al. | 198/502.1 |
| 5,358,113 A | 10/1994 | Hellenbrand | |
| 5,377,975 A | 1/1995 | Clapper, Jr. | |
| 5,398,932 A | 3/1995 | Eberhardt et al. | |
| 5,399,005 A | 3/1995 | Schafer | |
| 5,406,872 A | 4/1995 | Conley, Jr. et al. | |
| 5,417,424 A | 5/1995 | Snowden et al. | |
| 5,440,106 A * | 8/1995 | Duck | 235/3 |
| 5,449,111 A | 9/1995 | Sauzedde et al. | |
| 5,451,996 A * | 9/1995 | Awai et al. | 347/214 |
| 5,476,190 A | 12/1995 | Herrmann et al. | |
| 5,492,398 A | 2/1996 | Schafer | |
| 5,529,564 A | 6/1996 | Hediger | |
| 5,549,233 A | 8/1996 | Clauser | |
| 5,580,311 A | 12/1996 | Haste, III | |
| 5,608,643 A | 3/1997 | Wichter et al. | |
| 5,609,337 A | 3/1997 | Clapper, Jr. | |
| 5,657,899 A | 8/1997 | Stoken | |
| 5,673,837 A | 10/1997 | Meschi | |
| 5,695,105 A | 12/1997 | Ohara | |
| 5,713,256 A | 2/1998 | Keeny | |
| 5,722,511 A | 3/1998 | Wakamiya | |
| 5,735,432 A | 4/1998 | Stoken et al. | |
| 5,749,277 A * | 5/1998 | Walker | 83/563 |
| 5,749,784 A | 5/1998 | Clapper, Jr. | |
| 5,772,510 A | 6/1998 | Roberts | |
| RE35,864 E | 7/1998 | Weingardt | |
| 5,803,308 A | 9/1998 | Rong | |
| 5,810,664 A | 9/1998 | Clapper, Jr. | |
| 5,836,498 A | 11/1998 | Turek | |
| 5,853,117 A | 12/1998 | Traise | |
| 5,862,968 A | 1/1999 | Traise | |
| 5,871,398 A | 2/1999 | Schneier et al. | |
| 5,902,983 A | 5/1999 | Crevelt et al. | |
| 5,927,541 A | 7/1999 | Stoken et al. | |
| 5,941,414 A | 8/1999 | Kasper | |
| 5,943,241 A | 8/1999 | Nichols et al. | |
| 5,944,354 A | 8/1999 | Feola | |
| 5,944,606 A | 8/1999 | Gerow | |
| 5,963,452 A | 10/1999 | Etoh et al. | |
| 5,979,729 A | 11/1999 | Schmidt et al. | |
| 5,983,197 A | 11/1999 | Enta | |
| 5,997,170 A | 12/1999 | Brodbeck | |
| 6,003,668 A | 12/1999 | Joyce | |
| 6,056,233 A | 5/2000 | Von Schenk | |
| D428,060 S * | 7/2000 | Roberts et al. | D20/2 |
| 6,181,981 B1 | 1/2001 | Varga et al. | |
| D441,227 S * | 5/2001 | Roberts et al. | D6/515 |
| 6,280,326 B1 | 8/2001 | Saunders | |
| D448,956 S * | 10/2001 | Roberts et al. | D6/515 |
| D448,957 S * | 10/2001 | Roberts et al. | D6/515 |
| 6,309,298 B1 | 10/2001 | Gerow | |
| 6,351,688 B1 | 2/2002 | Nichols et al. | |
| 6,356,794 B1 | 3/2002 | Perin, Jr. et al. | |
| 6,497,408 B1 | 12/2002 | Walker et al. | |
| 6,599,187 B2 | 7/2003 | Gerow | |
| 6,714,838 B2 | 3/2004 | Scrymgeour et al. | |
| 6,726,077 B2 | 4/2004 | Roberts et al. | |
| D503,744 S * | 4/2005 | Mirkovic et al. | D20/2 |
| 6,886,728 B2 * | 5/2005 | Roberts et al. | 225/103 |
| 6,932,258 B1 * | 8/2005 | Roberts et al. | 225/103 |
| 7,011,381 B2 * | 3/2006 | Roberts et al. | 312/34.4 |
| 7,032,793 B2 * | 4/2006 | Roberts et al. | 225/105 |
| D592,704 S * | 5/2009 | Becker et al. | D20/2 |
| 7,548,797 B2 * | 6/2009 | Perin et al. | 700/236 |
| 7,665,394 B2 * | 2/2010 | Roberts et al. | 225/100 |
| D620,049 S * | 7/2010 | Hultzman et al. | D20/2 |
| D620,050 S * | 7/2010 | Hultzman et al. | D20/2 |
| 2001/0034263 A1 | 10/2001 | Roberts | 463/17 |
| 2001/0048013 A1 * | 12/2001 | Roberts et al. | 225/2 |
| 2001/0049986 A1 | 12/2001 | Roberts et al. | |
| 2002/0100785 A1 * | 8/2002 | Roberts et al. | 225/2 |
| 2003/0045340 A1 * | 3/2003 | Roberts | 463/17 |
| 2006/0035698 A1 * | 2/2006 | Roberts et al. | 463/17 |

FOREIGN PATENT DOCUMENTS

| | | | |
|---|---|---|---|
| WO | WO 87/06527 | * | 11/1987 |
| WO | 94/11164 | | 5/1994 |
| WO | 94/20908 | | 9/1994 |
| WO | 95/22445 | | 8/1995 |
| WO | WO97/16369 | | 5/1997 |
| WO | WO 9952691 A1 | * | 10/1999 |
| WO | 01/42968 | | 6/2001 |

OTHER PUBLICATIONS

Take-a-Ticket, Inc., #400U "Ultimate" Take-a-Ticket, Inc. (TAT) Inc. In-Counters!!, "Public Gaming", Jul. 1999.

Ads of Schafer Systems Inc. (p. 37), "Public Gaming" Oct. 1998.

* cited by examiner

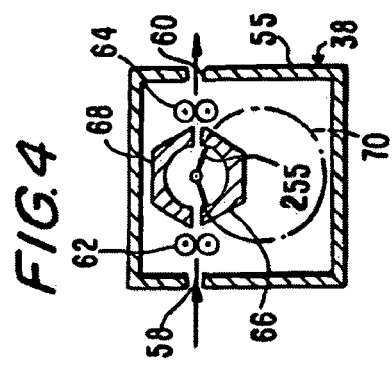
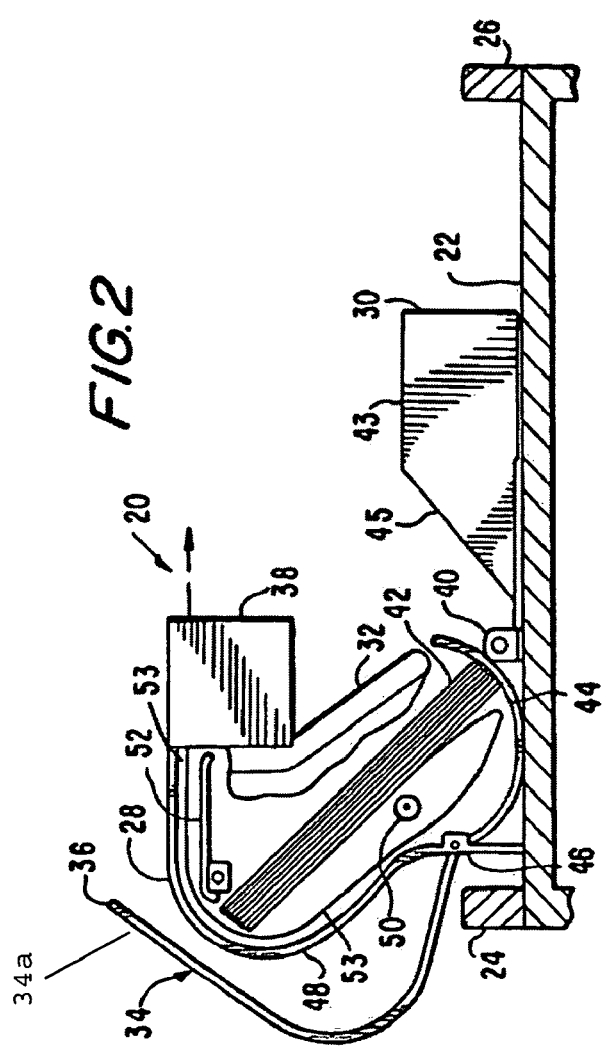
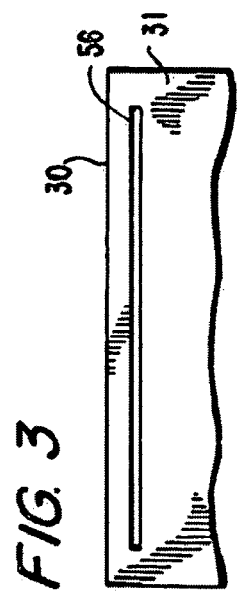

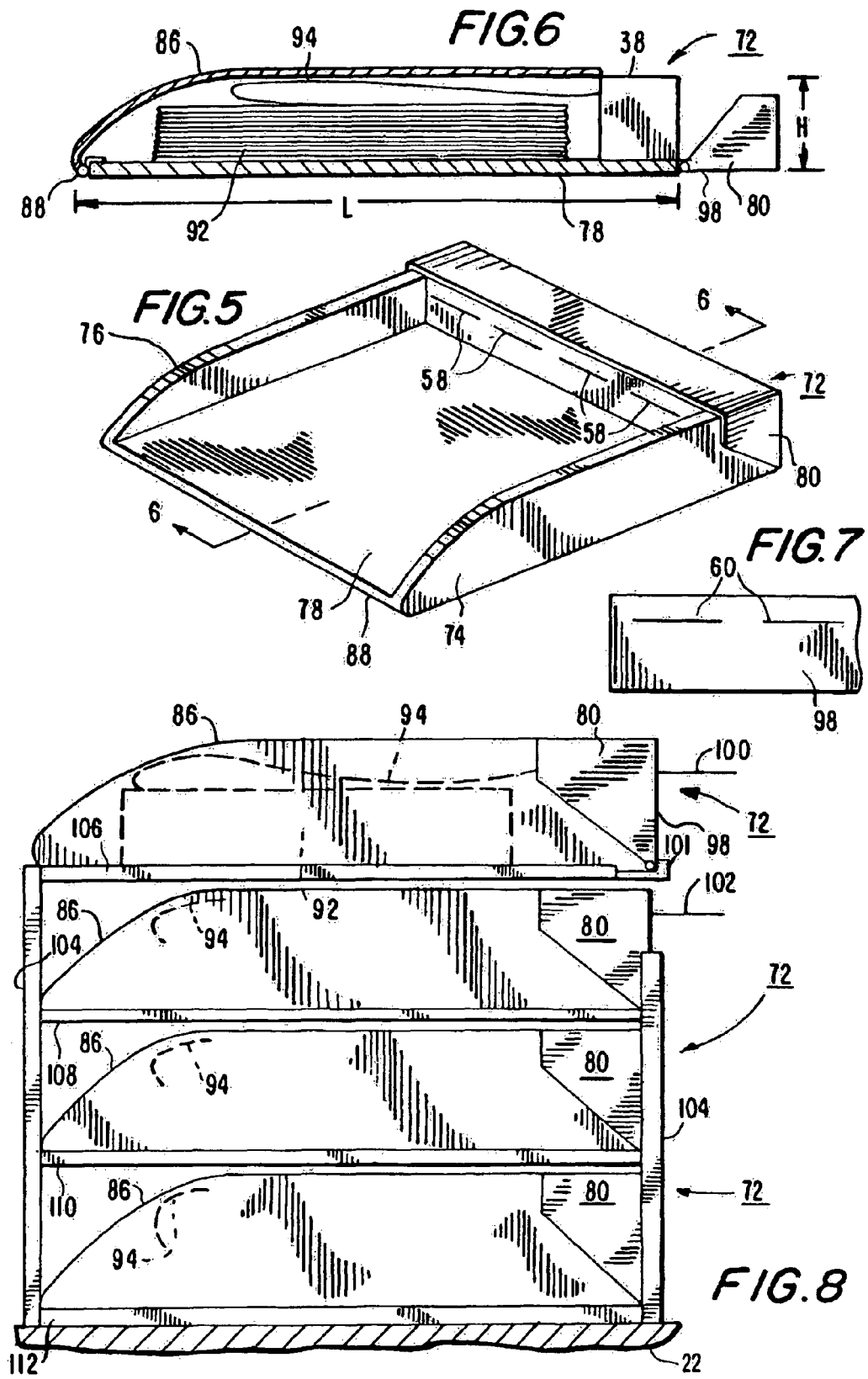

TICKET DISPENSING DEVICE, INSTALLATION AND DISPLAYS

This application is a continuation of U.S. application Ser. No. 09/394,660, now U.S. Pat. No. 7,032,793, filed Sep. 13, 1999, which is a continuation-in-part of U.S. application Ser. No. 09/238,682, filed Jan. 26, 1999, now U.S. Pat. No. 6,726,077, which is a continuation-in-part of U.S. application Ser. No. 09/128,406, filed Aug. 3, 1998, now abandoned, and which is a continuation-in-part of U.S. application Ser. No. 09/060,423, filed Apr. 14, 1998, now abandoned.

This invention relates to ticket dispensers, and particularly to dispensers of lottery tickets joined together in strips in which the tickets are delineated from one another by lines of weakness. In particular, the invention relates to such dispensers from which customers can see and select lottery tickets, and the tickets are dispensed by a store clerk or the customer.

One of the problems with prior lottery ticket dispensers of the type described above is that the dispensers take up a great deal of counter space and thus are in the way if they are placed on or near check-out counters in stores.

Another problem with such dispensers is that, when they are stacked on top of one another, they tend to shift and fall off. Moreover, it is difficult to see the tickets in the dispensers at the bottom of the stack because the customer's view is blocked by the upper dispensers in the stack.

Another problem with prior lottery ticket dispensers of the type described above is that the dispensers do not control the inventory of lottery tickets in the dispenser or account for the tickets sold during the dispensing process.

It is an object of the present invention to provide dispensing devices, installations and displays that eliminate or alleviate the foregoing problems.

In particular, it is an object of the invention to provide a ticket dispenser which is of the size and configuration to make it a welcome addition to a check-out counter.

Another object of the invention is to provide a rack or cabinet for stacking relatively short, wide ticket dispensers; a rack or cabinet that holds the dispensers in a stable stack structure.

A further object of the invention is to provide such a rack or cabinet which laterally staggers the positions of the dispensers, or of portions of the dispensers, relative to one another so that the lower dispensers in the stack are more visible.

It also is an object of the invention to provide a drive and separating module which can be easily mounted in any of the dispenser housings with a minimum of assembly, labor, tools and hardware.

It is a further object of the invention to provide such structures which are robust, relatively inexpensive to manufacture, and relatively easy and efficient to use.

In accordance with the present invention, the foregoing objects are met by the provision of a ticket dispenser which has a housing including a hinged front cover forming the top and portions of the side walls of the housing, and another hinged rear cover forming the rear complementary portions of the side walls of the housing, so that the front cover can be lifted to give access to the ticket storage area, and the rear cover can be rotated away to give access to the dispensing portion of the housing.

Another aspect of the invention is the provision of a rack or cabinet to support a plurality of relatively low and wide dispensers on top of one another so as to keep them stable. It is preferred that the positions of the dispenser housings, or portions of the dispenser housings, be staggered laterally so that lower ones of the housings are more visible than if the housings were stacked vertically with respect to one another.

It also is preferred that the length of dispensers at the top be less than that of dispensers below so as to align one end of each dispenser vertically with the corresponding ends of the other dispensers.

A check-out counter dispenser is provided which not only occupies relatively little check-out counter space, but also serves a useful function which makes it a desirable addition to the check-out counter. A relatively tall dispenser is provided in which space for storage of the tickets is located underneath a drive module. The stack of tickets to be dispensed is stored at a substantial angle from horizontal. The housing thus has a relatively small footprint and takes up relatively little countertop space.

Preferably, the top of the housing is flat and extends to a height making it a convenient surface upon which a customer can write checks. The tickets to be dispensed are visible through the transparent cover of the housing immediately below the flat top where the check is being written. This increases exposure of the tickets to the customers and promotes sales.

Preferably, each of the different sizes and shapes of housing uses a single drive and separation module which fits into the housing easily and quickly with a minimum of installation labor and hardware being required. The module contains a drive motor and drive rollers for a plurality of different channels, each adapted to drive one strip of tickets. A rotary helical separator mechanism is provided, with a drive motor to rotate it, so as to separate one or more tickets from each strip.

Preferably, the dispensing of the proper number and type of tickets is controlled by a clerk in the store operating a point-of-sale terminal or a computer, preferably a small palm top or similar computer with a keypad. Optionally, the actions performed by the clerk can also be performed by the customer and such computer controller can be mounted in such a location or position to allow dual use by both the clerk and/or the customer, e.g., the computer can be mounted on a swivel mounting.

The foregoing and other objects and advantage of the invention will be set forth in or apparent from the following description and drawings.

IN THE DRAWINGS

FIG. 2 is a cross-sectional view, taken along line 2-2 of FIG. 1, partially broken away, and showing the housing open instead of closed as in FIG. 1;

FIG. 3 is a front elevation view, partially broken away, of the dispenser shown in FIGS. 1 and 2;

FIG. 4 is a cross-sectional, partially schematic side elevation view of the drive and separation module used in the dispenser of FIGS. 1 through 3, as well as in other dispensers described herein;

FIG. 5 is perspective view of a relatively short but wide countertop dispenser in which the tickets are stored laterally of the drive and separation module;

FIG. 6 is a cross-sectional, partially schematic view of the dispenser shown in FIG. 5;

FIG. 7 is a partially broken away front elevation view of the dispenser shown in FIGS. 5 and 6;

FIG. 8 is a side elevation view of a display rack for multiple ticket dispensers of the type shown in FIGS. 5 through 7;

SMALL FOOTPRINT DISPENSER

Figure 1:
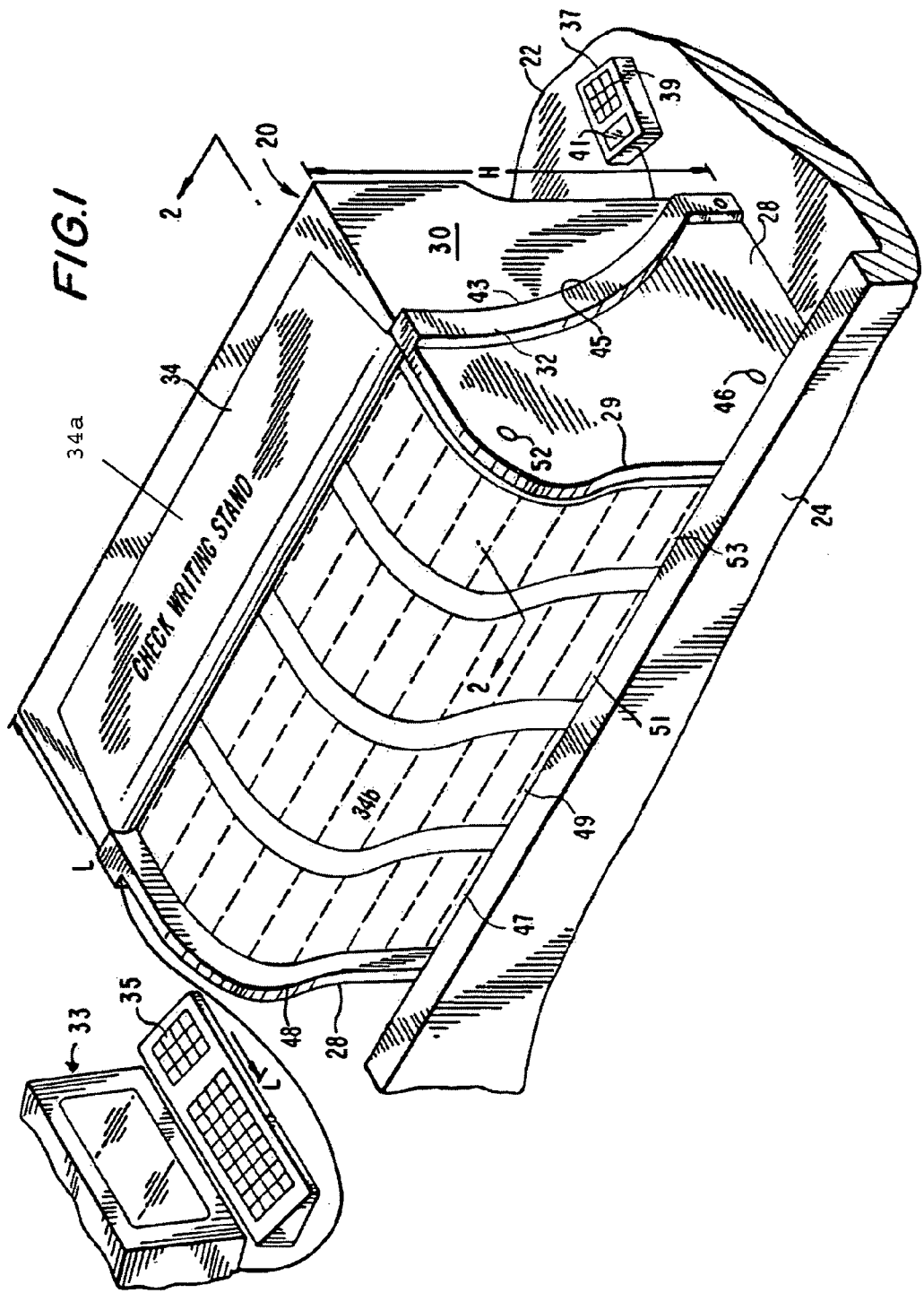
FIG. 1 is perspective, partially schematic view of a countertop ticket dispenser installation on check-out counter in a store.

FIG. 1 shows a dispenser unit 20 mounted on a check-out counter 22 with side rails 24 and 26 in a retail store or supermarket checkout lane. The unit 20 has a particularly small footprint, even though it dispenses instant winner scratch-off type lottery tickets from four different channels and from four relatively wide or long stacks 42 of tickets (See FIG. 2).

The unit 20 includes a housing with a pair of side walls 28 made of cast aluminum or other strong, secure material, with a curved portion 29 protruding out over the side-rail 24 of the check-out counter 22, or flush with the front of the counter depending on the installation. The rail 24 is on the side of the counter that is nearest to the normal position of the customer when having his or her purchases checked-out.

The check-out stand includes a point-of-sale terminal or computer 33 with a keyboard 35, or a hand-held computer 37 with a keypad 39 and a display 41. Alternatively, terminal 33 can be an on-line lottery game terminal such as those used to sell lotto and similar games. Any of these input devices can be used to select the type of ticket and quantity of tickets desired by the customer, as described more fully in the disclosure in the above-identified co-pending U.S. patent applications.

The housing of the dispensing unit 20 further includes a front cover 34 (see FIG. 2) which is hinged to the side walls 28 at a front hinge 46 so as to fold to the left and away from the interior of the dispenser housing to give access to the interior for replenishing tickets, service, etc.

The housing of the unit 20 also includes a hinged rear cover 30 which has a pair of side panels each having a forward edge 43 and a sloping edge 45. The cover 30 is hinged to the side walls 28 at a rear hinge 40.

The side walls 28 have an angular reinforcing rib 32 along a portion of the rear edge of the front cover 34. The edges 45 and 43 of the rear cover 30 abut against the ribs 32 when the covers 30, 34 are closed.

When the cover 34 is closed it is seated against a ledge 48 formed around the periphery of each of the side walls 28.

Mounted in the housing is a drive and separation module 38 which pulls a strip of tickets from a supply, separates the number of tickets desired from the strip, and issues them through an outlet opening to the right, as shown in FIG. 2.

Four fan-fold ticket stacks 42 each consisting of a continuous strip of scratch-off lottery tickets or similar tickets is stored in the housing at a location partially below the drive module 38 so as to help minimize the footprint of the dispenser.

Additionally, the footprint is minimized by storing the ticket stacks 42 at a substantial angle to horizontal. This is accomplished by use of a curved support 44 at one end of each stack, and a roller 50 for supporting each stack. The support 44, in essence, serves as a bottom wall for the dispenser housing.

A ticket strip 53 is taken off of the left-hand face of the ticket stack 42, around the roller 50, and upwardly past the upper edge of the stack, and over a curved guide 52 into an inlet opening 58 (see FIG. 4) of the drive unit 38.

As it is shown in FIGS. 1 and 2, the top portion 34a of the front cover 34 of the housing is flat. Since the housing extends vertically by a substantial distance, this flat surface is very convenient to the customer standing at the check-out counter while having his or her purchases checked-out to write on. In particular, it can be used as a check-writing stand.

Preferably, the rear cover 30 can be locked in place. Preferably, an edge of the front cover 34 overlies the edge of the rear cover 30 so as to lock the housing and prevent unauthorized access.

FIG. 3 is a front elevation view of the rear cover 30 showing its rear wall 31 with a thin slot 56 extending across most of the width of the housing, through which tickets can be dispensed.

Referring again to FIG. 1, four strips of tickets 47, 49, 51 and 53 are stored in the housing. A transparent portion 34b of the front cover allows the customer to clearly see the tickets in the four channels of the dispenser mechanism, whether or not the top is used as a writing surface.

Thus, because of its relatively small footprint, the unit 20 is less obtrusive than prior countertop powered ticket dispensers. Moreover, it is a welcome addition to the check-out counter since its top provides a convenient check-writing surface for the customers' use.

Drive/Separator Module

Drive/separator module 38 is shown schematically in FIG. 4. The module 38 includes a drive module housing or enclosure 55 with a plurality of inlet openings 58 (FIG. 5), one for each channel of the dispenser. Four sets of input drive rollers 62 and four sets of output drive rollers 64 are provided. Tickets are issued through four outlet slots 60 (See FIG. 7).

As it is described in greater detail in the above-identified co-pending patent applications, a separator mechanism is provided. It is formed by two halves 66 and 68 of a separator housing which forms a cylindrical interior in which rotates a set of helical separator blades 255, one for every channel, extending from a single shaft (see FIG. 12). A drive system is indicated by the dashed-circle 70. It includes a single drive motor for selectively driving the drive rollers 62 and 64, and a motor to rotate the helical separator 255 to separate tickets from the ticket strips.

Figure 11:
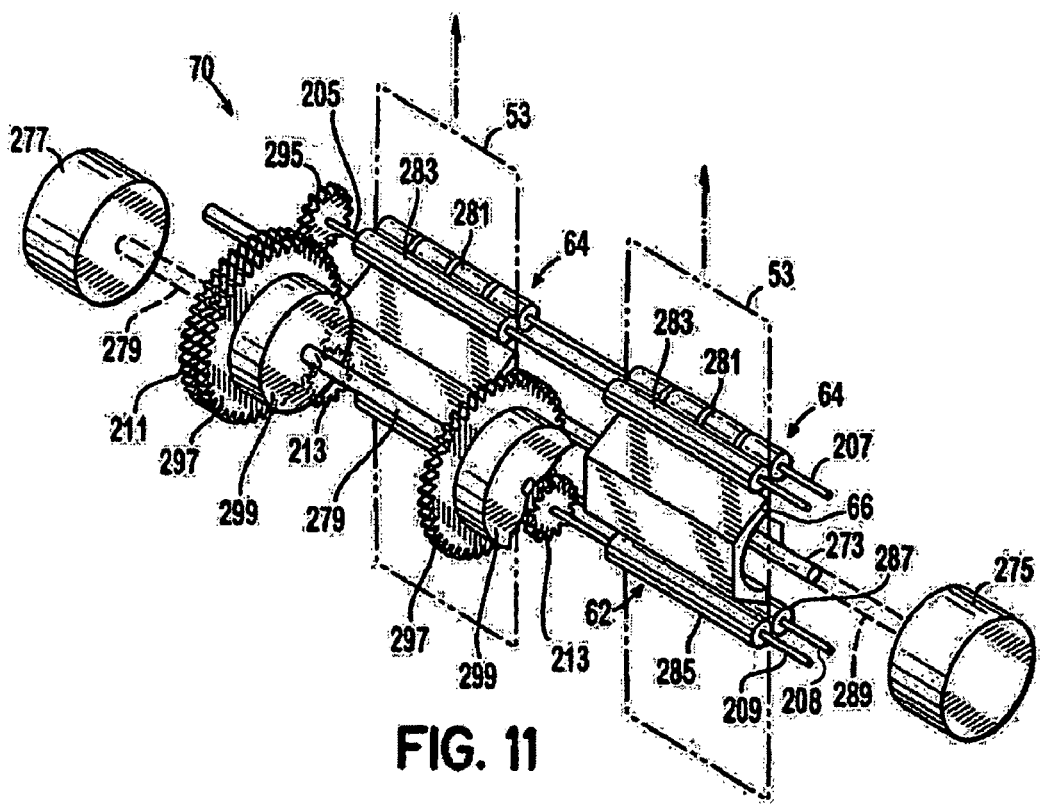
FIG. 11 is a perspective, partially broken-away and partially schematic view of the structure shown in FIG. 4.

FIG. 11 is a perspective schematic view of a separator and drive mechanism oriented 90 degrees with respect to that shown in FIG. 4 and which has only two channels instead of four, for the sake of simplification of the drawings.

The set of output rollers 64 includes a separate set of idler rollers 281 for each channel, and a drive roller 283 engaged with the idler rollers. Each of the four sets of idler rollers is mounted on a common shaft 207, and each of the drive rollers 283 is secured to a separate common shaft 205.

Similarly, the set of input rollers 62 includes a set of idlers 287 mounted rotatably on a common shaft 208, and multiple separate drive rollers 285 mounted rotatably on a separate common shaft 209. A small spur gear 213 is secured to each roller 285.

A small spur gear 295 is secured at one end to the shaft 205, to which each driver roller 283 is secured, and meshes with a large spur gear 211 secured to a drive shaft 279. Similarly, each of the independent idler rollers 281 rotates freely on a common shaft 207. Therefore, all of the drive output rollers 283 will rotate when the shaft 279 is rotated.

A drive motor 277, preferable a stepping motor, is provided and is coupled to the shaft 279. A combination of a large spur gear 297 and an electrically-operated clutch 299 is provided for each channel. Each clutch 299 is separately operable to drivably couple the associated spur gear 297 with the drive shaft 279.

When one of the clutches is so operated, the spur gear 297 drives the small spur gear 213 to rotate one of the rollers 285 for one channel to move the ticket strip 53 (shown in dashed outline) through the device drive/separator module 38.

The leading edge of each ticket or sequence of tickets is detected by photocell detectors (not shown). When it is determined, by counting the number of steps taken by the motor 277, that the ticket strip is in a proper position for the separation of one or more tickets from the strip, the drive rollers stop, and a separator drive motor 275 connected through a shaft 289 to the shaft 273 of a helical separator member 257 rotates the helical separator member 257 through one revolution and causes one or more tickets to be separated from the strip along a perforated line.

Figure 12:
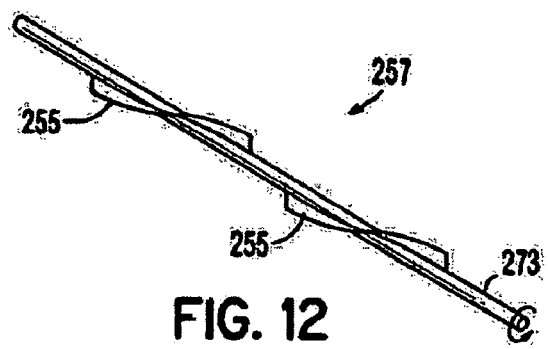
FIG. 12 is a perspective view of the helical separator member of the structure shown in FIGS. 4 and 11.

FIG. 12 is a perspective view showing the helical separator member 257 with two helical blades 255, one for each of the two channels of the drive/separator module 38 shown in FIG. 11. As it is more fully described in the foregoing copending U.S. patent applications, each helical blade 255 extends around the shaft 273 and is secured to it so that its edge travels through an angle of 180 degrees. The rotation of the shaft causes the tickets to be torn along a perforated line quickly, neatly and reliably.

When the separate operation has been completed, the drive motor 277 again drives the drive rollers 283 which causes the ticket or tickets to be driven out of the module 38 (FIG. 4).

It is notable that four channels, six channels and even more can be driven with a single drive motor and a single separator motor, thus significantly reducing the complexity, size and cost as compared with prior separator systems. Further details of this unit need not be described here because of the complete description appearing in the above-identified co-pending patent applications.

Low and Flat Countertop Dispenser

FIGS. 5 through 10, and particularly FIGS. 5 and 6, show a relatively low flat dispenser structure 72.

Whereas the aspect ratio, that is, the ratio of the height H to length L of the dispensing unit 20 shown in FIG. 1 is around 1 or greater, the ratio of H to L in the units 72 is substantially less than 1. The dispensing units 72 (FIGS. 5 and 6) can be used in areas near the countertop of a check-out area or another counter in a store where there is more space and a larger footprint for the dispenser is acceptable.

The dispenser 72 includes a housing and a drive module 38 disposed in the housing, wherein the housing includes a bottom wall 78, a pair of metal side walls 74 and 76 extending upwardly from to the bottom wall 78, a hinged transparent cover 86 which is hinged to the rear edge of the bottom wall 78 by means of a hinge indicated schematically at 88 in FIGS. 5 and 6. The hinged cover 86 is curved in the rear portion so it forms a curved rear wall for the housing, as well as a top cover for the housing.

The housing of the dispensing unit 72 also has a hinged front cover 80, which may include slots 97 and a front surface 98, through which tickets may be disbursed (see FIG. 7), and which may fold down, as shown in FIG. 6 to allow ready access to the drive module 38. By opening the cover 86, access is given to the interior of the housing for replenishing ticket supplies, etc.

The ticket strip in each of the four channels is pulled back over the top of their respective stacks 92 of tickets and back towards the right where it enters the inlet opening 58 of the drive module 38. By taking this path, the tickets in each strip are very visible to someone viewing the unit from the rear or the left, as it is shown in FIG. 6. The dispenser 72 may also optionally include a plurality of vertical dividers extending between the rear wall 86 and the area adjacent the front wall 80, the powered dispensing mechanism 38 located between the vertical dividers and the front wall 80.

As with the unit 20 shown in FIG. 1, the front cover 80 can be locked with a key lock (not shown), and this is effective to lock the cover 86 as well.

FIG. 8 shows a display rack in which four of the units 72 are stacked one atop the other. The display rack includes vertical members 104 at the four corners of the structure secured to a plurality of horizontal shelves 106, 108, 110 and 112. Preferably, the shelves have an upstanding ridge 101 around the periphery to keep the dispensing units from sliding off.

It should be understood that the display rack is intended to be representative also of a display cabinet which has side walls to further enclose the dispensing units, for better security and/or better appearance.

The vertical members 104 at the corners of the structure can be angles or other suitable metal structural members, and the shelves can be similar structural members and attached to the vertical members. Cross-bracing can be provided as needed.

Tickets 100 and 102 are shown after they have been dispensed and are ready for the clerk to grasp and hand to the customer, who normally stands to the left of the display in FIG. 8.

Staggered Display

Figure 9:
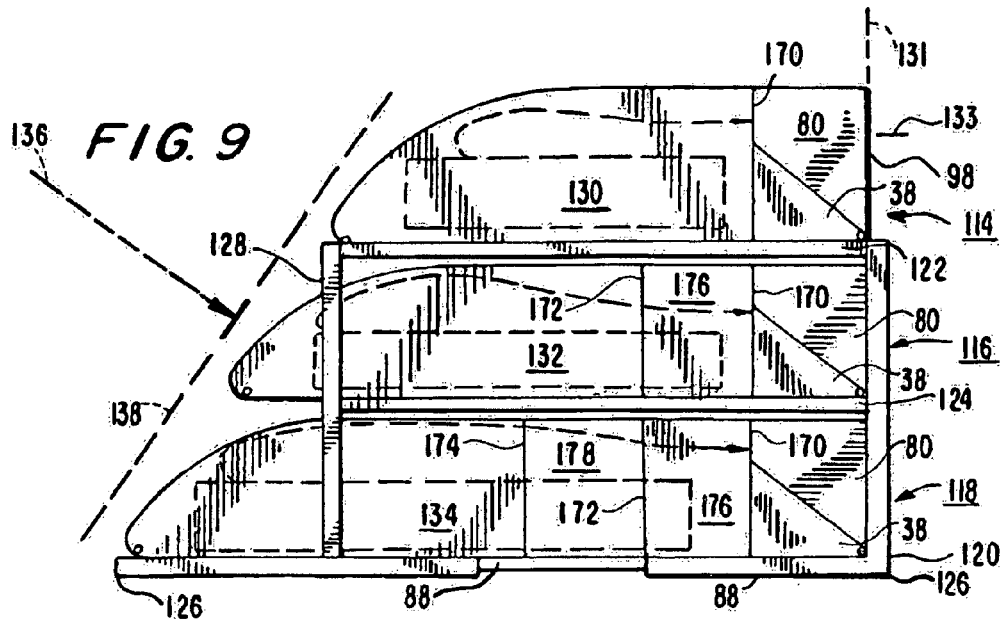
FIG. 9 is a side elevation view of an alternative display of ticket dispensers.

FIG. 9 shows a different embodiment of the dispenser display of the invention. Three dispenser units 114, 116 and 118, like or identical to the dispenser 72, are mounted on shelves 122, 124 and 126 of a display rack having vertical structural members 120 and 128. The vertical member 128 is spaced laterally to the right of the left edge of the bottom shelf 126. Each of these shelves, as with the shelves of the unit shown in FIG. 8, has a peripheral ridge like the ridge 101 shown in FIG. 8 (however not depicted in FIG. 9) to minimize the chances of one of the dispensing units falling off of the display rack.

As shown, the rear walls of each of the units 114, 116 and 118 are staggered relative to one another. That is, the rear wall of the unit 116 is recessed to the right as shown in FIG. 9 relative to the unit 118, and the rear wall of the unit 114 is similarly staggered to the right relative to both units 116 and 118. The rear walls can be staggered along a line of any shape, but in this case are staggered relative to a sloping straight line 138 in FIG. 9.

It also is preferred that each of the three dispensers, 114, 116, and 118 are of different lengths so that the front surfaces of the units will be approximately aligned vertically along a line 131.

The different lengths of the dispenser can be created by adding to the standard length dispenser tray one or more extension pieces, of the same length. All housing extension pieces are identical and secured to one another and/or the standard dispenser tray by means of a mating male and female connector.

This "standard" length dispenser is dispenser 114 shown in FIG. 9. The housing is divided into two sections, one to the left of the vertical line 170, and one to the right of that line. The line 170 is located near the left boundary of the drive and separator module 38. The dispenser housings are secured together with tongue-and-groove elements (not shown) which are farce fitted force-fitted together, or with another suitable fastening arrangement.

To form the larger dispenser 116, another section of the housing, in the form of insert 176, is fastened between the left and right sections, with suitable fastening means, like those used to fasten the right and left sections together.

Similarly, to form the longest housing 118, a second insert 178 is secured between the left section and the insert 176.

By the foregoing construction, the hinged covers, the left section, the right section and the inserts all can be standardized to ensure economy of manufacture.

As it can be seen, the length of the stack 130 in the top dispenser 114 is shorter than the length of the stacks 132 and 134 in the housing lower dispensers 116 and 118, respectively. However, it should be understood that a short stack of a single size could be used in two or more of the dispensers, depending upon the need.

A ticket 133 is shown protruding from the front face of the dispenser 114 ready for a clerk to grasp it to hand to the customer who is standing to the left of the display.

The display shown in FIG. 9 is particularly advantageous because it maximizes the viewing area of the rear portions of the dispensers when viewed from an angle such as that indicated by the dashed line 136 in FIG. 9.

Figure 10:
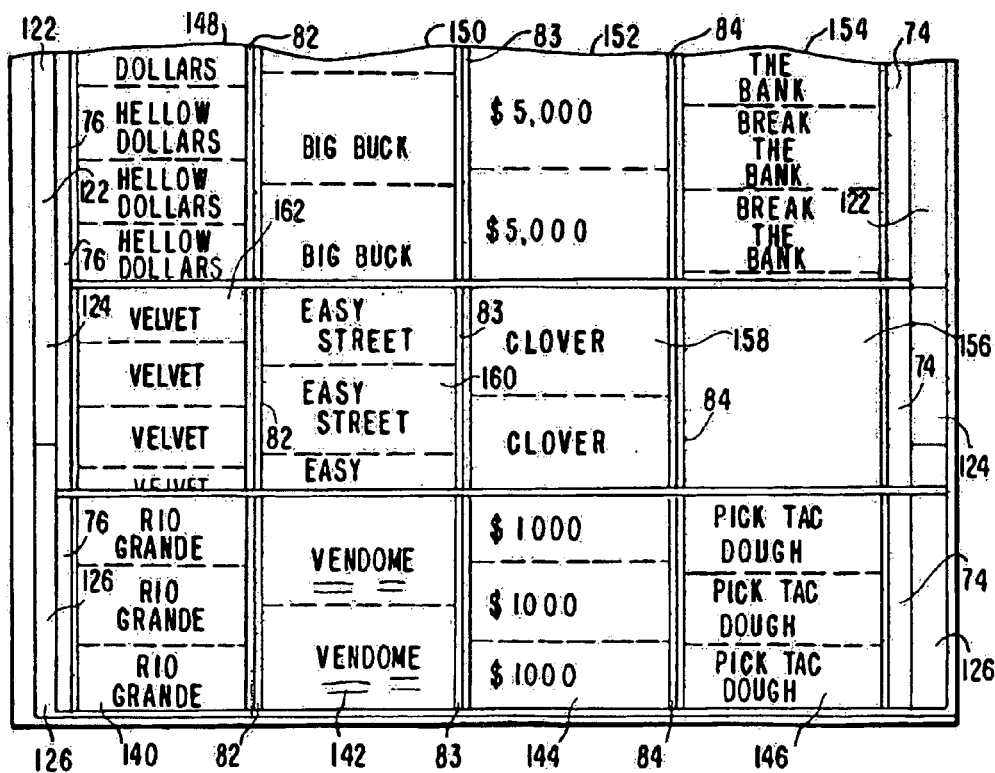
FIG. 10 is a rear elevation view as viewed in the direction of the arrow 136 in FIG. 9.

FIG. 10 is a view, partially broken away of the display of FIG. 9 taken from the angle indicated by the line 136.

The dispenser 114 contains four strips 148, 150, 152 and 154 of tickets. Similarly, the dispenser 118 at the bottom of the stack has four strips of different tickets 140, 142, 144 and 146. A plurality of vertical dividers 82, 83, and 84 extend between said rear and adjacent said front walls, separating the strips of tickets.

The middle dispenser 116 has only three strips of tickets 158, 160 and 162. The fourth channel 156 is empty. The plurality of vertical dividers 82, 83, and 84 extend between said rear and adjacent said front walls, separating the strips of tickets.

As it can be seen, from the angle indicated by the arrow 136, a relatively large area of each of the three dispensers is visible. Also, the staggering of the units makes it appear as if there is simply one large display consisting of multiple tickets available to the customer. Thus, the customer does not need to bend over and peer intently at an obscure lower or middle dispenser in a dispenser stack, but can readily see the tickets to choose ones he or she desires. This again facilitates attracting buyers and selling tickets.

It also should be understood that the display rack shown in FIG. 9 is intended to be representative of a housing as well which provides more enclosure at the sides, and perhaps at the top so as to make a more attractive and sturdier display.

The above description of the invention is intended to be illustrative and not limiting. Various changes or modifications in the embodiments described may occur to those skilled in the art. These can be made without departing from the spirit or scope of the invention.

The invention claimed is:

1. A ticket dispenser for pre-printed lottery tickets, comprising: a plurality of arrays of pre-printed scratch-off lottery tickets in strips with individual tickets being delineated from one another in an array by lines of weakness;

a housing having a bottom support structure, a pair of side walls extending upwardly from said bottom support structure, a front wall hinged adjacent its bottom edge to said bottom support structure at a first side so as to swing outwardly and downwardly, a cover hinged to said bottom support structure at a side opposite said first side and shaped to cover said bottom support structure with space between said bottom support structure and said cover, said space containing the plurality of arrays of tickets; and a powered drive module inside said housing, said drive module being positioned adjacent said front wall, the drive module positioned and configured to receive strips of tickets from said arrays, said module containing a drive mechanism configured to, responsive to a command to dispense a requested quantity of tickets from a selected one of said arrays, to dispense the requested quantity of tickets from the selected one of said arrays, said drive module further including a powered separator configured to separate tickets from the selected one of said arrays prior to the tickets being dispensed from the ticket dispenser, wherein said drive module comprises a drive module housing, which forms an enclosure, having at least one inlet opening for admitting plural parallel ticket strips into said enclosure, at least one outlet opening for issuing tickets from one of said strips, a drive motor driving a drive shaft, a plurality of input drive rollers rotatably mounted on a common shaft, and a selectively operable transmission configured to selectively couple said input drive rollers to said drive shaft for selectively feeding tickets in one of said strips through said module and out through said outlet opening.

2. A ticket dispenser as in claim 1 in which said space is located laterally from said drive module, and in which the ratio of the height of said housing to the distance between said front wall and said opposite side of said bottom wall is substantially less than one.

3. A ticket dispenser as in claim 1 in which said space is located at least partially underneath said drive module and the ratio of the height of said housing to the distance between said front wall and said opposite side of said bottom wall is around one or greater.

4. A ticket dispenser as in claim 1 in which said cover is at least partially transparent, and said cover forms a curved rear wall for said enclosure, said housing comprising two sections joined together along a vertical line adjacent the inlet side of said drive module, and at least one housing extension element having bottom, top and side walls secured between said housing halves.

5. A ticket dispenser as in claim 1 in which said space and said drive module are in superposed relation to one another.

6. A ticket dispenser as in claim 5 in which said cover has a flat upper surface and said drive module is located above said space.

7. A ticket dispenser as in claim 5 including a support structure in said housing holding one of the ticket strips in the form of a flat stack at a substantial angle with respect to horizontal.

8. A ticket dispensing display unit, said dispensing display unit comprising:

a rack with a plurality of shelves;

a plurality of dispensers on said shelves, each of the dispensers having a powered dispensing mechanism disposed in a low flat-topped housing, the housing including a curved rear wall and a front wall, and a transparent cover forming the rear wall of said housing;

said shelves being spaced apart vertically from one another, the rear wall of each of said dispensers being laterally offset from the rear wall of the dispenser below it in a configuration permitting a person looking through the rear walls of the housing of the dispenser to see tickets stored on each of said shelves.

9. A display unit as in claim 8 in which the housing of each of the dispensers has a height and a length from the rear wall to the front wall, in which said length is much greater than said height; and in which said length of said housings is shorter for dispensers located higher in the display unit, each of said housings comprising two portions joined together along a vertical line adjacent an inlet of said drive module, and at least one housing extension element having bottom, top and side walls secured between said housing halves.

10. A display unit as in claim 8 in which each of said powered dispensing mechanisms includes a separator mechanism configured to separate tickets from strips of tickets delineated from one another by lines of weakness and to issue said tickets through outlets in said front wall, said housing providing space storing and displaying multiple strips of tickets through said cover.

11. A display unit as in claim 8 in which each of said housings has a bottom wall and pair of side walls secured to said respective bottom wall, said cover being hinged to said bottom wall to permit access to the interior of the housing, said front wall being hinged to said bottom wall to allow access to the area in said housing adjacent said front wall.

12. A display unit as in claim 8 in which each of said housings has a plurality of vertical dividers extending between said rear and said front walls, said powered dispensing mechanism being located between said dividers and said front wall in each housing.

13. A display unit as in claim 8 in which said powered dispensing mechanism comprises an enclosure, a drive motor and rollers in said enclosure, and a separator member and drive means for driving said separator member.

14. The ticket dispensing display unit of claim 8, further comprising:
   a plurality of arrays of pre-printed scratch-off lottery tickets in strips with individual tickets being delineated from one another in an array by lines of weakness, wherein each shelf has stored thereon at least one of said strips of scratch-of lottery tickets.

* * * * *